United States Patent
Wu (10) Patent No.: US 6,767,825 B1
(45) Date of Patent: Jul. 27, 2004

(54) ETCHING PROCESS FOR FORMING DAMASCENE STRUCTURE OF THE SEMICONDUCTOR

(75) Inventor: Chih-Ning Wu, Hsin-Chu (TW)

(73) Assignee: United Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 10/356,754

(22) Filed: Feb. 3, 2003

(51) Int. Cl.[7] .......................................... H01L 21/4763
(52) U.S. Cl. ........................ 438/633; 438/637; 438/638; 438/671; 438/672; 438/700; 438/712; 438/717
(58) Field of Search ................................. 438/633, 637, 438/638, 671, 672, 700, 712, 717

(56) References Cited

U.S. PATENT DOCUMENTS 6,394,104 B1 * 5/2002 Chen et al. .................. 134/1.1
6,457,477 B1 * 10/2002 Young et al. ................. 134/1.2
6,468,916 B2 * 10/2002 Choi et al. ................... 438/706
2003/0119305 A1 * 6/2003 Huang et al. ................ 438/633

* cited by examiner

Primary Examiner—Hsien-Ming Lee
(74) Attorney, Agent, or Firm—Arent Fox (57) ABSTRACT

First of all, a breakthrough process is performed for removing the polymer and oxidized residues remained on top surface of the hard-mask layers, wherein the breakthrough process utilizes a $CF_x$-based mixed-gas, such as $Ar/O_2/CF_4$, to slightly flush out the top surface of the hard-mask layers so as to strip the polymer and oxidized residues remained thereon. Afterward, an etching process is performed to etch through the hard-mask layers until a predetermined thickness of the dielectric layer. Finally, another etching process is performed to etch through the hard-mask layer and the dielectric layer and form the damascene structure in the dielectric layer, wherein this etching process utilizes the mixed gas having chlorine, such as $O_2/Cl_2$.

32 Claims, 7 Drawing Sheets

ETCHING PROCESS FOR FORMING DAMASCENE STRUCTURE OF THE SEMICONDUCTOR

BACKGROUND OF THE INVENTION

1. Field of the Invention

The present invention relates generally to a process for manufacturing of the damascene structure of the semiconductor device, and more particularly to an etching process for forming the damascene structure of the semiconductor device.

2. Description of the Prior Art

When semiconductor devices of integrated circuits (IC) become highly integrated, the surface of the chips can not be supplied with enough area to make the interconnects. For matching the requirement of interconnects increases with Complementary Metal-Oxide-Semiconductor (CMOS) devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which is used to separate from each of the interconnects. A conducting wire which connects between the upper and the lower metal layers is called the via plug in semiconductor industry. In general, if an opening, which forms in the dielectric layer exposure to devices of the substrate in, interconnects, it is called the contact hole.

It has two methods for conventional via and interconnect processes, one method is the via and interconnect finish by oneself, wherein the method is that the dielectric is first formed on the metal layer, and then the photoresist layer (PR) is defined on the dielectric, and use the etching process to make the via, and deposit conduction material in the via by means of deposition to finish the via process, then deposit and define metal layer, final, deposit the dielectric layer whereon. Conventional forming metal interconnect process is that make the via and the interconnect by means of two lithography process. Thus, it needs cumbrous steps of deposit and pattern. And yet, it will result in difficult patterned interconnects due to the multi layer connect layout is more daedal in the sub-quarter micron. Therefore, damascene interconnect structure is developed at present. According to particulars of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene include two patterns, one is the deep patterns, that is the via patterns or via-first scheme; another is the shallow patterns or the line patterns, that is the trench patterns or trench-first scheme. For production manufacturing of deep sub-micro devices, the photoresist and nonmetal/metal hard-mask layers with much less etch-resistant wavelength are often implemented in the dual-damascene etching process. In the conventional dual-damascene structure, it easily induced the large defects of carbon residues in the Cu CMP process if the CMP slurry directly polishes onto the low-k dielectric film, and the SiC layer is one of the candidate dielectric films to cap on the low-k materials and to serve as CMP polish stop layer for preventing the generation of CMP defects. For example, in the trench-first process scheme, the partial via etching was carried out after hard-mask open, and the dual-damascene structure was simultaneously formed during the trench etching. However, because of slight oxidation in the surface of SiC layer, especially in the dual hard-mask film stack of oxide/SiC, it is difficult to etch SiC layer. In accordance with the above description, a new and improved method for forming the damascene structure is therefore necessary, so as to raise the yield and quality of the follow-up process.

SUMMARY OF THE INVENTION

In accordance with the present invention, a new method for forming the damascene structure is provided that substantially overcomes drawbacks of above mentioned problems raised from the conventional methods.

Accordingly, one of the objects in the present invention provides an etching process for forming the damascene structure. The present invention utilizes two-steps etching process to etch the hard-mask layer so as to form the damascene structure. Furthermore, in this invention, the two-steps etching process comprises a breakthrough step and an etching step, wherein the breakthrough step utilizes a $CF_x$-based mixed-gas, such as $Ar/O_2/CF_4$, to slightly flush out the top surface of the hard-mask layer for removing the remained polymer and oxidized residues; and further, the etching step utilizes a mixed-gas having chlorine, such as $Cl_2/O_2$, to pre-etch the hard-mask layer and partial dielectric layer until forming an opening in the dielectric layer, and then the damascene structure is formed by this structure. Therefore, this invention can effectively arise the performance, the quality and yield of the semiconductor process such that this invention corresponds to economic effect and utilization in industry, and it is appropriate for deep sub-micron technology.

In accordance with the present invention, a new etching process for forming the damascene structure is provided. First of all, a semiconductor substrate with a first dielectric layer thereon is provided, and then both the first and second hard-mask layers are sequentially formed on the first dielectric layer, wherein the first hard-mask layer is served as the polished-stop layer in the follow-up chemical mechanical polishing process (CMP). Then a first photoresist layer is formed and defined on the second hard-mask layer as the etching mask to perform a first etching process, so as to etch through the second and the first hard-mask layers until a predetermined thickness in the first hard-mask layer, whereby a first opening having a first pattern is formed on the first hard-mask layer. After removing the first photoresist layer, a breakthrough process is performed for removing the polymer and oxidized residues remained on top surface of the second and the first hard-mask layers, wherein the breakthrough process utilizes a $CF_x$-based mixed-gas, such as $Ar/O_2/CF_4$, to slightly flush out the top surface of the second and the first hard-mask layers so as to strip the polymer and oxidized residues remained thereon. Afterward, a second dielectric layer is formed on the second hard-mask layer and the first opening is filled with that, wherein the material of the second dielectric layer can serve as the anti-reflection coating layer (ARC) or the bottom anti-reflection coating layer (BARC). Next, a second photoresist layer is formed and defined on the second dielectric layer, and then a second etching process is performed by the second photoresist layer as an etching mask to etch through the second dielectric layer and the first hard-mask layer until a first predetermined thickness of the first dielectric layer, and form a second opening having a second pattern in the first dielectric layer. After removing the second photoresist layer and the second dielectric layer, a third etching process is performed by the second hard-mask layer as an etching mask to etch through the first hard-mask layer and the first dielectric layer until exposing the semiconductor substrate, wherein the first hard-mask layer can retard the etching rate of the first opening during the third etching process, and the third etching process utilizes the mixed gas having chlorine, such as $O_2/Cl_2$, so as to adjust the etching selectivity by the mixing ratio of the chlorine in the mixed gas, that is, the mixing ratio of the chlorine in the mixed gas is higher, the etching selectivity of the first to the second hard-mask layer is higher. Finally, the second hard-mask layer is removed to form a dual-damascene structure in the dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

What is probed into in the invention is a method for calculating the coordinates of an electromagnetic inductive system with a multi-antenna loop layout and battery-less pointer device. Detailed steps in production, structure and elements will be provided in the following description in order to make the invention thoroughly understood. Obviously, the application of the invention is not confined to specific details familiar to those who are skilled in electromagnetic inductive system. On the other hand, the common elements and procedures that are known to everyone are not described in the details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

As illustrated in FIG. 1A to FIG. 1D, in the first embodiment of the present invention, first of all, a semiconductor substrate 100 is provided, and then a silicon-carbon layer 110, such as SiC, and the silicon-oxide layer 120 are sequentially formed on the semiconductor substrate 100. Then a photoresist layer 130 is formed and defined on the silicon-oxide layer 120, and a first etching process 140 is performed by the photoresist layer 130 as an etching mask to etch the silicon-oxide layer 120 until exposing partial surface of the silicon-carbon layer 110 so as to form an opening 150 on the silicon-carbon layer 110. After removing the photoresist layer 130, a breakthrough process 160 is performed for removing the polymer and oxidized residues remained on top surface of the silicon-carbon layer 110 and the silicon-oxide layer 120, wherein the breakthrough process utilizes a $CF_x$-based mixed-gas, such as $Ar/O_2/CF_4$, to slightly flush out the top surface of the silicon-carbon layer 110 and the silicon-oxide layer 120 so as to strip the polymer and oxidized residues remained thereon. Afterward, a second etching process 170 is performed by the silicon-oxide layer 120 as the etching mask to etch the silicon-carbon layer 110 until exposing surface of the semiconductor substrate 100, wherein the second etching process 170 utilizes the mixed gas having chlorine, such as $O_2/Cl_2$, so as to adjust the etching selectivity by the mixing ratio of the chlorine in the mixed gas, that is, the mixing ratio of the chlorine in the mixed gas is higher, the etching selectivity of the silicon-carbon layer 110 to the silicon-oxide layer 120 is higher. Finally, the silicon-oxide layer 120 is removed to form a trench structure 180 on the semiconductor substrate 100.

Figure 1A:
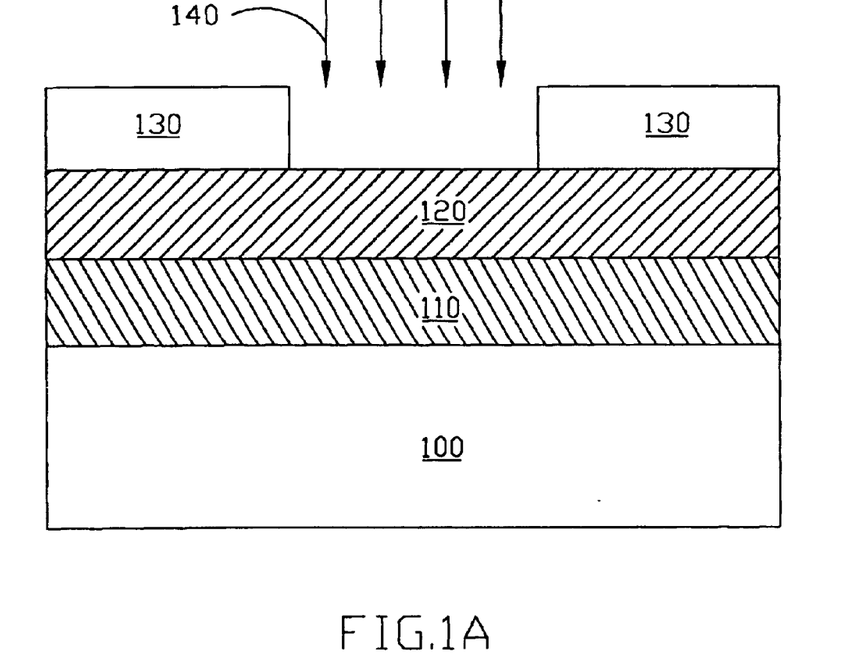
FIGS. 1A to 1D show cross-sectional views illustrative of various stages of the method for forming the trench by the etching process with two steps in accordance with the first embodiment of the present invention.
Figure 1B:
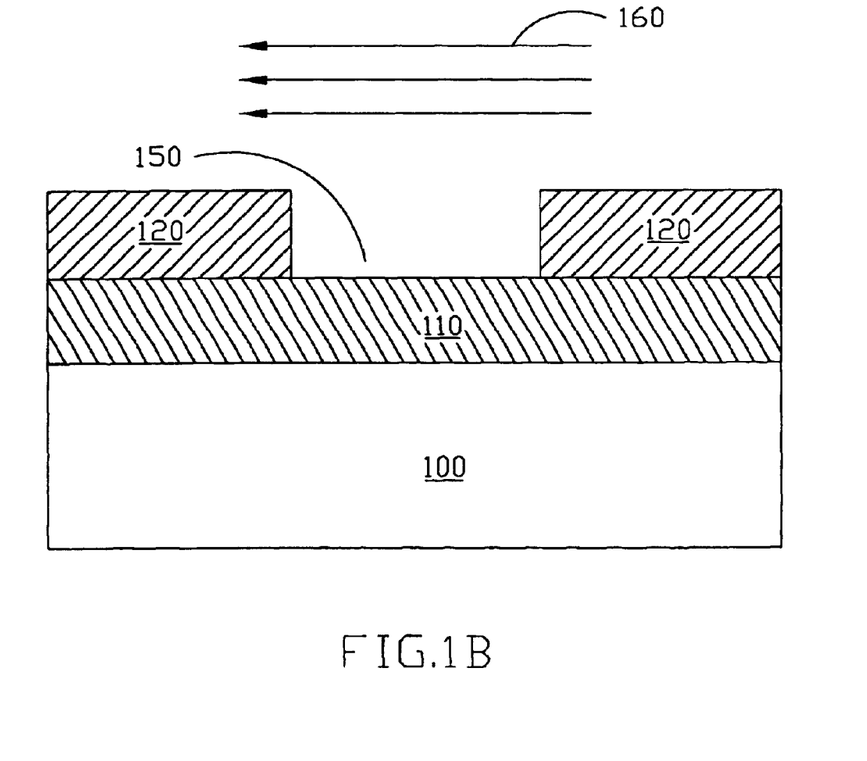
Figure 1C:
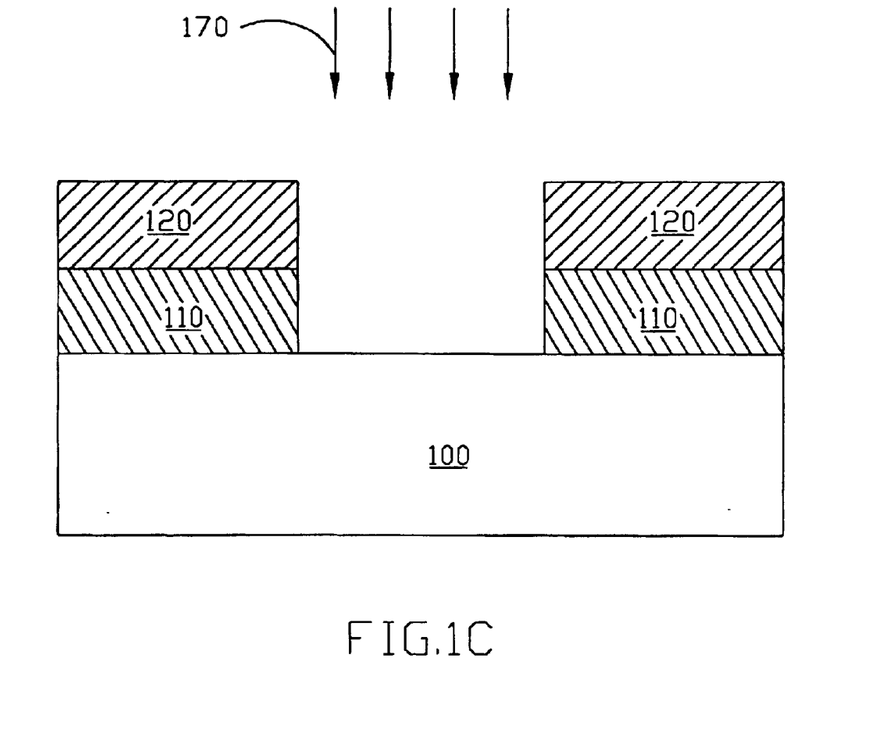
Figure 1D:
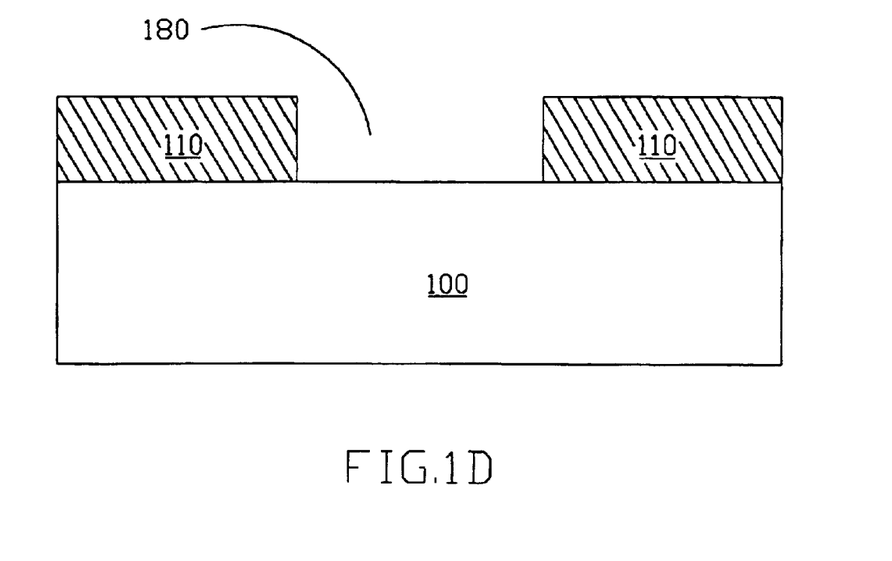
Figure 2A:
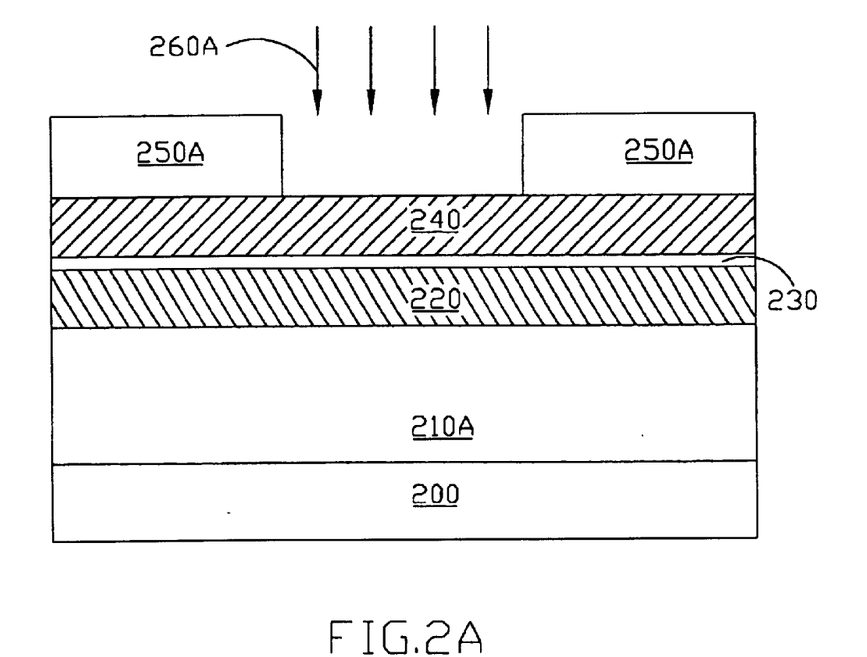
FIGS. 2A to 2E show cross-sectional views illustrative of various stages of the method for forming the damascene structure by the etching process with two steps in accordance with the first embodiment of the present invention.
Figure 2B:
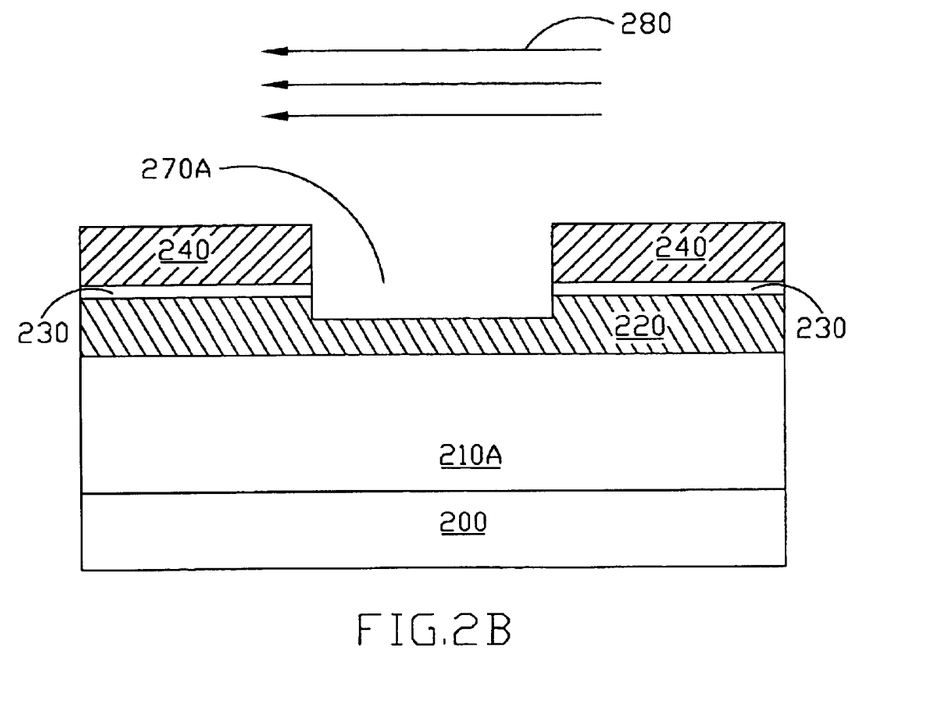
Figure 2C:
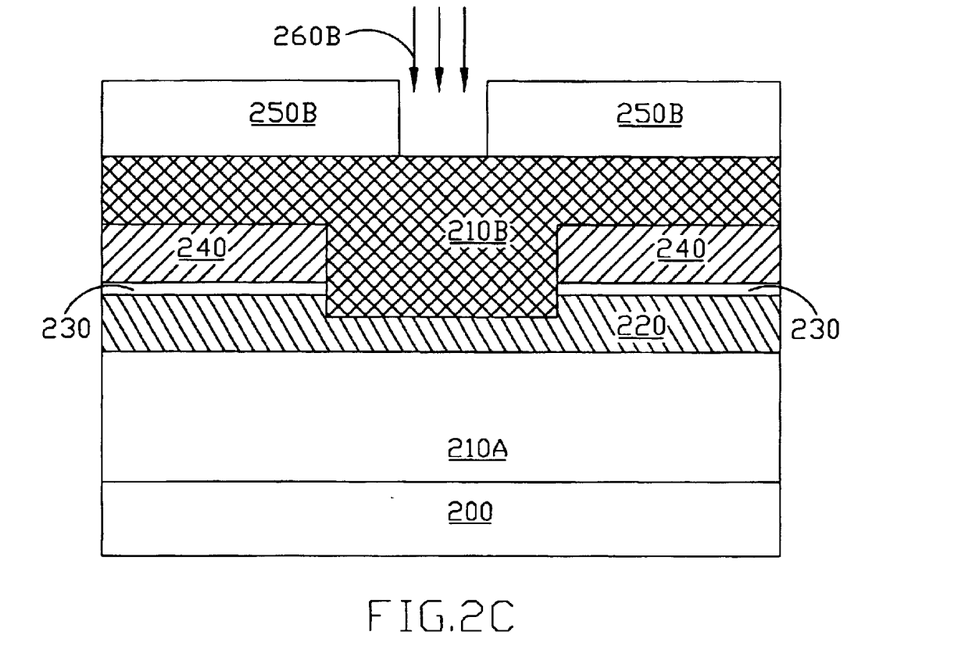
Figure 2D:
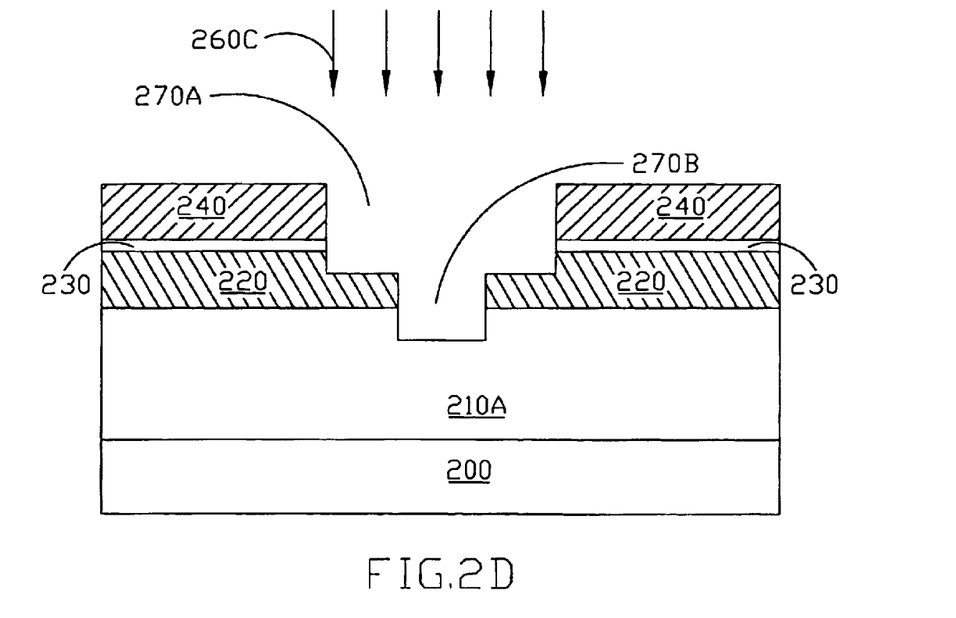
Figure 2E:
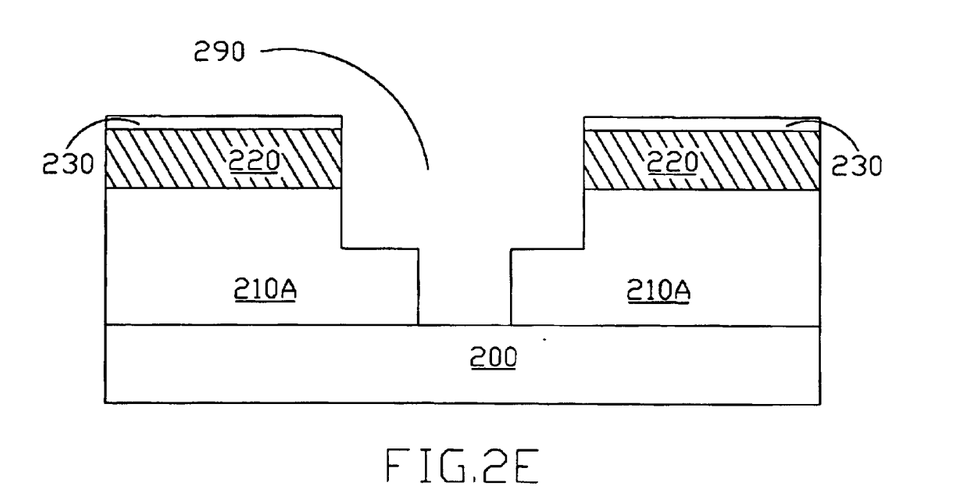

As illustrated in FIG. 2A and FIG. 2E, in the second embodiment of the present invention, first of all, a semiconductor substrate 200 with a first dielectric layer 210A having low-K thereon is provided, and then a first hard-mask layer 220, a metal layer 230 and second hard-mask layer 240 are sequentially formed on the first dielectric layer 210A, wherein the first hard-mask layer 220 is served as the polished-stop layer in the follow-up chemical mechanical polishing process (CMP), and the first hard-mask layer 220 comprises a silicon-carbon material, such as SiC, and the second hard-mask layer 240 comprises an oxide material. Then a first photoresist layer 250A is formed and defined on the second hard-mask layer 240 as the etching mask to perform a first etching process 260A, so as to etch through the second hard-mask layer 240, the metal layer 230 and the first hard-mask layer 220 until a first predetermined thickness in the first hard-mask layer 220, whereby a first opening 270A having a first pattern is formed on the first hard-mask layer 220, wherein the first pattern is a shallow pattern or the trench pattern. After removing the first photoresist layer 250A, a breakthrough process 280 is performed for removing the polymer and oxidized residues remained on top surface of the second and the first hard-mask layers 240/220, wherein the breakthrough process 280 utilizes a $CF_x$-based mixed-gas, such as $Ar/O_2/CF_4$, to slightly flush out the top surface of the second and the first hard-mask layers 240/220 so as to strip the polymer and oxidized residues remained thereon. Afterward, a second dielectric layer 210B is formed on the second hard-mask layer 240 and the first opening 270 is filled with that 210B, wherein the material of the second dielectric layer 210B can serve as the anti-reflection coating layer (ARC) or the bottom anti-reflection coating layer (BARC). Next, a second photoresist layer 250B is formed and defined on the second dielectric layer 210B, and then a second etching process 260B is performed by the second photoresist layer 250B as an etching mask to etch through the second dielectric layer 210B and the first hard-mask layer 220 until a second predetermined thickness of the first dielectric layer 210A, and form a second opening 270B having a second pattern in the first dielectric layer 210A, wherein the second pattern is a deep pattern or a via pattern. After removing the second photoresist layer 250B and the second dielectric layer 210B, a third etching process 260C is performed by the second hard-mask layer 240 as an etching mask to etch through the first hard-mask layer 220 and the first dielectric layer 210A until exposing the semiconductor substrate 200, wherein the first hard-mask layer 220 can retard the etching rate of the first opening 270A during the third etching process 260C, and the third etching process 260C utilizes the mixed gas having chlorine, such as $O_2/Cl_2$, so as to adjust the etching selectivity by the mixing ratio of the chlorine in the mixed gas, that is, the mixing ratio of the chlorine in the mixed gas is higher, the etching selectivity of the first 220 to the second hard-mask layer 240 is higher. Finally, the second hard-mask layer 240 is removed to form a dual-damascene structure 290 in the first dielectric layer 210. In this embodiment, it is noted that the metal layer 230 can be included in the stacked structure of the second hard-mask layer 240, so the formation of the metal layer 230 is really not necessity, and that it should be depended on the requirement of the entire process.

Figure 3A:
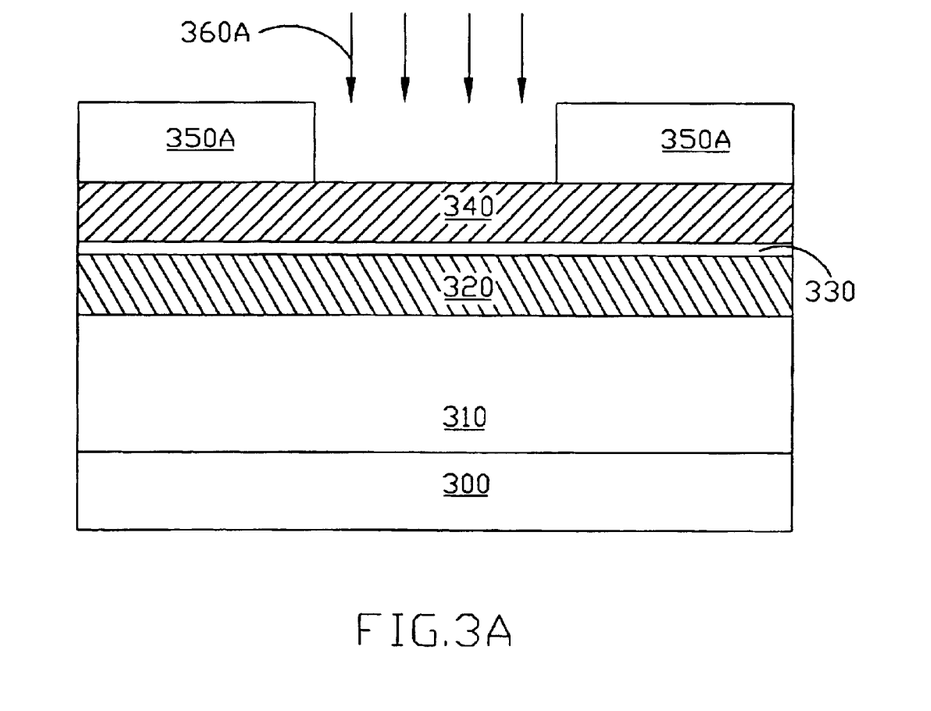
FIGS. 3A to 3E show cross-sectional views illustrative of various stages of the method for forming the damascene structure by the etching process with two steps in accordance with the third embodiment of the present invention.
Figure 3B:
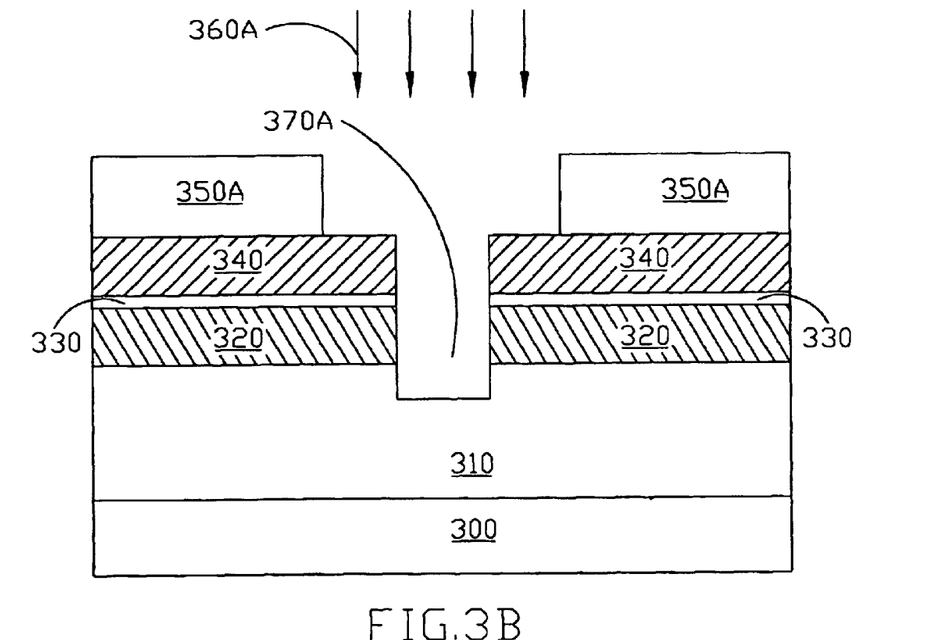
Figure 3C:
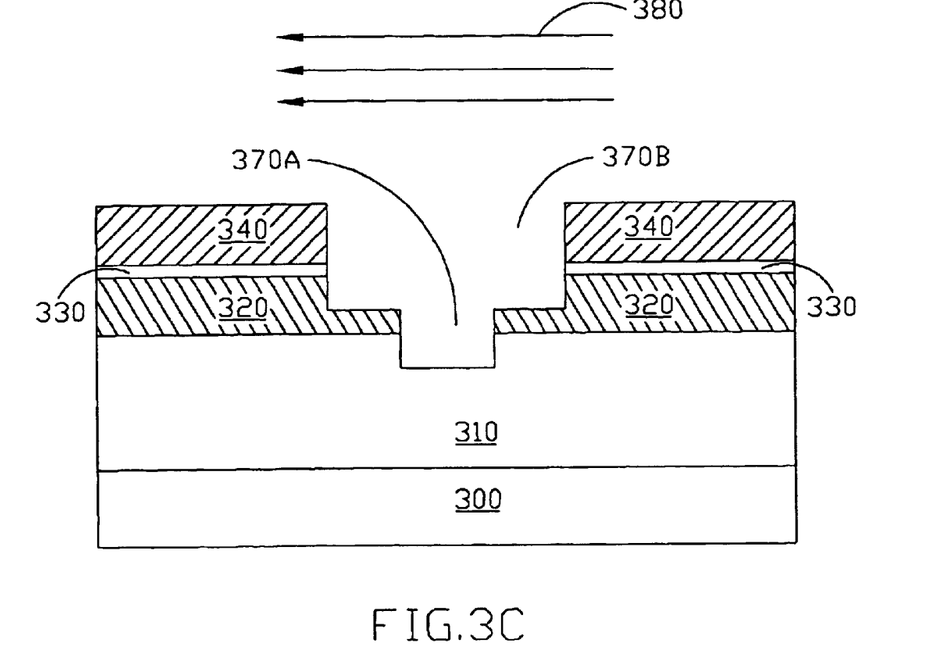
Figure 3D:
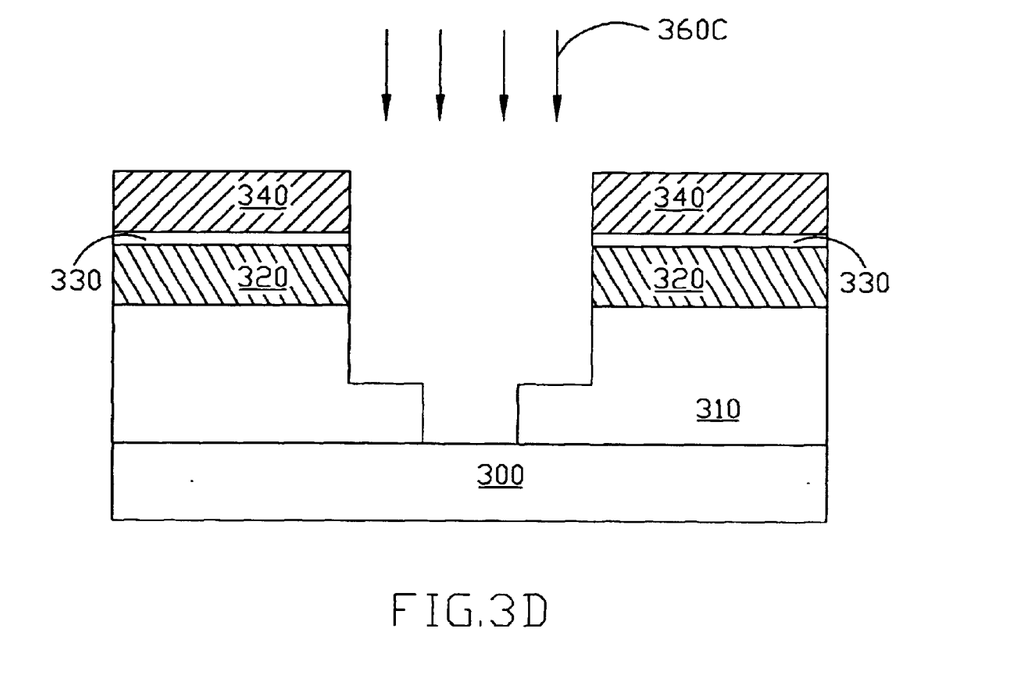
Figure 3E:
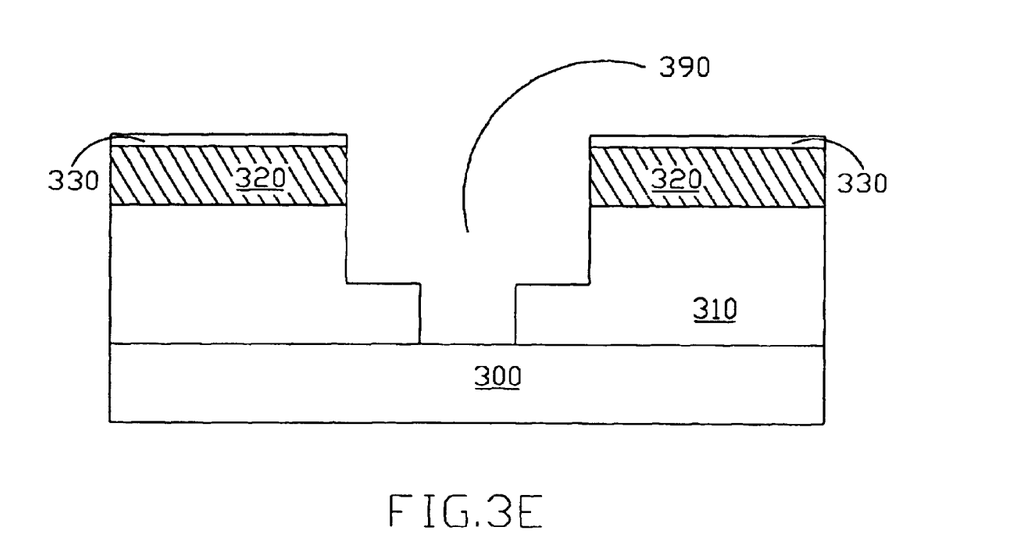

As illustrated in FIG. 3A and FIG. 3E, in the third embodiment of the present invention, first of all, a semiconductor substrate 300 with a dielectric layer 310 having low-K thereon is provided, and then a first hard-mask layer 320, a metal layer 330 and second hard-mask layer 340 are sequentially formed on the dielectric layer 310, wherein the first hard-mask layer 320 is served as the polished-stop layer in the follow-up chemical mechanical polishing process (CMP), and the first hard-mask layer 320 comprises a silicon-carbon material, such as SiC, and the second hard-mask layer 340 comprises an oxide material. Then a first photoresist layer 350A is formed and defined on the second hard-mask layer 340 as the etching mask to perform a first etching process 360A, so as to etch through the second hard-mask layer 340, the metal layer 330 and the first hard-mask layer 320 until a first predetermined thickness in the dielectric layer 310, whereby a first opening 370A having a first pattern is formed on the dielectric layer 310, wherein the first pattern is a deep pattern or a via pattern. After removing the first photoresist layer 350A, a second photoresist layer 350B is formed and defined on the second hard-mask layer 340, and then a second etching process 360B is performed by the second photoresist layer 350B as the etching mask to etch through the second hard-mask layer 340, the metal layer 330 and the first hard-mask layer 320 until a second predetermined thickness of the first hard-mask layer 320, and form a second opening 370B having a second pattern in the first hard-mask layer 320, wherein the second pattern is a shallow pattern or the trench pattern. After removing the second photoresist layer 350B, a breakthrough process 380 is performed for removing the polymer and oxidized residues remained on top surface of the whole structure as described in the foregoing, wherein the breakthrough process 380 utilizes a $CF_x$-based mixed-gas, such as $Ar/O_2/CF_4$, to slightly flush out the top surface of the second and the first hard-mask layers 340/320 so as to strip the polymer and oxidized residues remained thereon. Subsequently, a third etching process 360C is performed by the second hard-mask layer 340 as the etching mask to etch through the first hard-mask layer 320 and the dielectric layer 310 until exposing the semiconductor substrate 300, wherein the first 15 hard-mask layer 320 can retard the etching rate of the second opening 370B during the third etching process 360C, and the third etching process 360C utilizes the mixed gas having chlorine, such as $O_2/C_2$, so as to adjust the etching selectivity by the mixing ratio of the chlorine in the mixed gas, that is, the mixing ratio of the chlorine in the mixed gas is higher, the etching selectivity of the first 320 to the second hard-mask layer 340 is higher. Finally, the second hard-mask layer 340 is removed to form a dual-damascene structure 390 in the dielectric layer 310. In this embodiment, it is noted that the metal layer 330 can be included in the stacked structure of the second hard-mask layer 340, so the formation of the metal layer 330 is really not necessity, and that it should be depended on the requirement of the entire process.

In these embodiments of the present invention, the present invention can pre-remove the polymer and oxidized residues remained on the hard-mask layer by the breakthrough step to easily etch the hard-mask layer. Furthermore, this invention utilizes performing an opening in the top surface of the dielectric layer to avoid the micro-loading effect, and this invention also utilizes an etching process with the mixing gas having chlorine to achieve a high etching selectivity, such as the etching selectivity of SiC to oxide is about 5:1. Of course, it is possible to apply the present invention to perform the process for forming the damascene process, and to any etching process for forming the semiconductor devices. Also, the etching process with two steps in the present invention can be applied to form the dual-damascene structure, and it has not been developed concerning the damascene process at present. The method of the present invention is the best process for forming the damascene structure with two steps for deep sub-micro process.

Obviously, many modifications and variations of the present invention are possible in light of the above teachings. It is therefore to be understood, that within the scope of the appended claims, the present invention may be practiced other than as specifically described herein. Although specific embodiments have been illustrated and described, it will be obvious to those skilled in the art that various modifications may be made without departing from what is intended to be limited solely by the appended claims.

What is claimed is:

1. A method for forming the trench structure, the method comprising:
   providing a substrate;
   sequentially forming a silicon-carbon layer and a silicon-oxide layer on said substrate;
   etching said silicon-oxide layer until exposing partial surface of said silicon-carbon layer to form an opening on said silicon-carbon layer;
   performing a breakthrough process to remove the polymer and oxidized residues remained on top surface of said silicon-carbon layer and said silicon-oxide layer;
   performing an etching process by using said silicon-oxide layer as the etching mask to etch said silicon-carbon layer until exposing surface of said substrate; and
   removing said silicon-oxide layer to form a trench structure on said substrate.

2. The method according to claim 1, wherein said breakthrough process slightly flushes out the top surface of said silicon-carbon layer and said silicon-oxide layer to strip the polymer and oxidized residues remained thereon.

3. The method according to claim 1, wherein said breakthrough process utilizes a $CF_x$-based mixed-gas.

4. The method according to claim 3, wherein said $CF_x$-based mixed-gas comprises a mixing gas having $Ar/O_2/CF_4$.

5. The method according to claim 1, wherein said etching process utilizes a mixed gas having chlorine.

6. The method according to claim 5, wherein said mixed gas having chlorine comprises a mixing gas having $O_2/Cl_2$.

7. The method according to claim 5, wherein the etching selectivity of said silicon-carbon layer to said silicon-oxide layer of said etching process can be adjusted by adjusting the mixing ratio of the chlorine in said mixed gas.

8. The method according to claim 7, wherein the etching selectivity of said silicon-carbon layer to said silicon-oxide layer is increased as the mixing ratio of the chlorine in said mixed gas is increased.

9. A method for forming the damascene structure, the method comprising:

provi ding a substrate with a first dielectric layer thereon;

sequentially forming a first hard-mask layer and a second hard-mask layer on said first dielectric layer;

etching said second hard-mask layer and said first hard-mask layer until a first predetermined thickness in said first hard-mask layer to form a first opening having a first pattern on said first hard-mask layer;

performing a breakthrough process to remove the polymer and oxidized residues remained on top surface of said second hard-mask layer and said first hard-mask layers;

forming a second dielectric layer on said second hard-mask layer and filling said first opening;

etching said second dielectric layer and said first hard-mask layer until a second predetermined thickness of said first dielectric layer to form a second opening having a second pattern in said first dielectric layer;

removing said second dielectric layer;

performing an etching process by using said second hard-mask layer as the etching mask to etch through said first hard-mask layer and said first dielectric layer until exposing said substrate; and removing said second hard-mask layer to form a damascene structure in said first dielectric layer.

10. The method according to claim 9, wherein said first hard-mask layer comprises a silicon-carbon material.

11. The method according to claim 9, wherein said second hard-mask layer comprises an oxide material.

12. The method according to claim 9, wherein said first pattern is a shallow pattern, and said second pattern is a deep pattern.

13. The method according to claim 9, wherein said breakthrough process slightly flushes out the top surface of said second hard-mask layer and said first hard-mask layer to strip the polymer and oxidized residues remained thereon.

14. The method according to claim 9, wherein said breakthrough process utilizes a $CF_x$-based mixed-gas.

15. The method according to claim 14, wherein said $CF_x$-based mixed-gas comprises a mixing gas having $Ar/O_2/CF_4$.

16. The method according to claim 9, wherein said first hard-mask layer can retard the etching rate of said first opening during said etching process.

17. The method according to claim 9, wherein said etching process utilizes a mixed gas having chlorine.

18. The method according to claim 17, wherein said mixed gas having chlorine comprises a mixing gas having $O_2/Cl_2$.

19. The method according to claim 17, wherein the etching selectivity of said silicon-carbon layer to said silicon-oxide layer of said etching process can be adjusted by adjusting the mixing ratio of the chlorine in said mixed gas.

20. The method according to claim 17, wherein the etching selectivity of said silicon-carbon layer to said silicon-oxide layer is increased as the mixing ratio of the chlorine in said mixed gas is increased.

21. A method for forming the damascene structure, the method comprising:

providing a substrate with a dielectric layer thereon;

sequentially forming a first hard-mask layer and a second hard-mask layer on said dielectric layer;

etching said second hard-mask layer, said first hard-mask layer and said dielectric layer until a first predetermined thickness in said dielectric layer to form a first opening having a first pattern on said dielectric layer etching said second hard-mask layer and said first hard-mask layer until a second predetermined thickness in said first hard-mask layer to form a second opening having a second pattern in said first hard-mask layer;

performing a breakthrough process is performed to remove the remained polymer and oxidized residues;

performing an etching process by using said second hard-mask layer as the etching mask to etch through said first hard-mask layer and said dielectric layer until exposing the substrate; and removing said second hard-mask layer to form a damascene structure in said dielectric layer.

22. The method according to claim 21, wherein said first hard-mask layer comprises a silicon-carbon material.

23. The method according to claim 21, wherein said second hard-mask layer comprises an oxide material.

24. The method according to claim 21, wherein said first pattern is a deep pattern, and said second pattern is a shallow pattern.

25. The method according to claim 21, wherein said breakthrough process slightly flushes out the top surface of said second hard-mask layer and said first hard-mask layer to strip the polymer and oxidized residues remained thereon.

26. The method according to claim 21, wherein said breakthrough process utilizes a $CF_x$-based mixed-gas.

27. The method according to claim 26, w herein said $CF_x$-based mixed-gas comprises a mixing gas having $Ar/O_2/CF_4$.

28. The method according to claim 21, wherein said first hard-mask layer can retard the etching rate of said first opening during said etching process.

29. The method according to claim 21, wherein said etching process utilizes a mixed gas having chlorine.

30. The method according to claim 29, wherein said mixed gas having chlorine comprises a mixing gas having $O_2/Cl_2$.

31. The method according to claim 29, wherein the etching selectivity of said silicon-carbon layer to said silicon-oxide layer of said etching process can be adjusted by adjusting the mixing ratio of the chlorine in said mixed gas.

32. The method according to claim 29, wherein the etching selectivity of said silicon-carbon layer to said silicon-oxide layer is increased as the mixing ratio of the chlorine in said mixed gas is increased.

* * * * *